(12) United States Patent
Zhang et al.

(10) Patent No.: US 11,613,806 B2
(45) Date of Patent: Mar. 28, 2023

(54) METHOD FOR PREPARING AMMONIUM THIOMOLYBDATE-POROUS AMORPHOUS CARBON COMPOSITE SUPERLUBRICITY FILM

(71) Applicant: Lanzhou Institute of Chemical Physics, Chinese Academy of Sciences, Lanzhou (CN)

(72) Inventors: Bin Zhang, Lanzhou (CN); Qian Jia, Lanzhou (CN); Junyan Zhang, Lanzhou (CN); Yuanlie Yu, Lanzhou (CN); Kaixiong Gao, Lanzhou (CN); Xingkai Zhang, Lanzhou (CN)

(73) Assignee: LANZHOU INSTITUTE OF CHEMICAL PHYSICS, CHINESE ACADEMY OF SCIENCES, Lanzhou (CN)

( * ) Notice: Subject to any disclaimer, the term of this patent is extended or adjusted under 35 U.S.C. 154(b) by 0 days.

(21) Appl. No.: 17/375,030

(22) Filed: Jul. 14, 2021

(65) Prior Publication Data

US 2022/0042167 A1 Feb. 10, 2022

(30) Foreign Application Priority Data

Aug. 4, 2020 (CN) .......................... 202010773228.X

(51) Int. Cl.
*C23C 14/35* (2006.01)
*C23C 14/00* (2006.01)
(Continued)

(52) U.S. Cl.
CPC ........ *C23C 14/352* (2013.01); *C23C 14/0057* (2013.01); *C23C 14/021* (2013.01);
(Continued)

(58) Field of Classification Search
CPC .............. C23C 14/352; C23C 14/0057; C23C 14/021; C23C 14/0605; C23C 14/16;
(Continued)

(56) References Cited

U.S. PATENT DOCUMENTS 4,230,539 A * 10/1980 Saruwatari ............. C25D 11/20
205/333
6,146,135 A * 11/2000 Watanabe ............... C30B 29/16
432/221
(Continued)

FOREIGN PATENT DOCUMENTS

CN 101665904 A * 3/2010
CN 102994947 A 3/2013
(Continued)

OTHER PUBLICATIONS

CN-104707629-A Translation (Year: 2015).*
(Continued)

*Primary Examiner* — Jennifer Wecker
*Assistant Examiner* — Patrick S Ott
(74) *Attorney, Agent, or Firm* — Fresh IP PLC; Clifford D. Hyra; Aubrey Y. Chen

(57) ABSTRACT

A method for preparing an ammonium thiomolybdate-porous amorphous carbon composite superlubricity film is disclosed. First, a porous amorphous carbon film is prepared by an anode layer ion source assisted plasma chemical vapor deposition method and a reactive magnetron sputtering method on a substrate. The porous amorphous carbon film is then impregnated in an ammonium thiomolybdate solution, so that the ammonium thiomolybdate is adsorbed on the porous amorphous carbon film, and the impregnated porous amorphous carbon film is air dried. During the friction process, the composited porous amorphous carbon superlubricity film prepared in the present disclosure promotes the
(Continued)

in-situ decomposition of ammonium thiomolybdate to generate molybdenum disulfide by utilizing the friction heat at the initial stage of running-in, further to generate a graphene-like structure under the function of a catalyst, thus realizing a macroscopic super lubricity through a heterogeneous incommensurate contact between graphene and molybdenum disulfide.

4 Claims, 3 Drawing Sheets

(51) Int. Cl.
  *C23C 14/02*   (2006.01)
  *C23C 14/06*   (2006.01)
  *C23C 14/16*   (2006.01)
  *C23C 14/34*   (2006.01)
  *C23C 14/58*   (2006.01)

(52) U.S. Cl.
  CPC .......... *C23C 14/0605* (2013.01); *C23C 14/16* (2013.01); *C23C 14/3485* (2013.01); *C23C 14/584* (2013.01)

(58) Field of Classification Search
  CPC .............. C23C 14/3485; C23C 14/584; C23C 14/165; C23C 14/46; C23C 14/58
  See application file for complete search history.

(56) References Cited

U.S. PATENT DOCUMENTS

| | | | | |
|---|---|---|---|---|
| 6,686,069 | B1* | 2/2004 | Okuyama | G11B 5/73913 |
| 2010/0196500 | A1* | 8/2010 | Kitakado | A23L 29/015 |
| | | | | 424/602 |
| 2011/0070529 | A1* | 3/2011 | Dadheech | H01M 8/0228 |
| | | | | 427/535 |
| 2011/0274918 | A1* | 11/2011 | Omata | A61L 31/10 |
| | | | | 428/457 |

FOREIGN PATENT DOCUMENTS

| | | | |
|---|---|---|---|
| CN | 104707629 A | * | 6/2015 |
| CN | 105644059 A | | 6/2016 |
| CN | 107032330 A | | 8/2017 |
| CN | 110488044 A | | 11/2019 |

OTHER PUBLICATIONS

CN-101665904-A Translation (Year: 2010).*
Maeshima, et al., Friction behaviour of anodic oxide film on aluminum impregnated with molybdenum sulfide compounds, 2000, Surface and Coatings Technology 132, 105-110 (Year: 2000).*

* cited by examiner

METHOD FOR PREPARING AMMONIUM THIOMOLYBDATE-POROUS AMORPHOUS CARBON COMPOSITE SUPERLUBRICITY FILM

CROSS REFERENCE TO RELATED APPLICATION

This application claims the priority of Chinese Patent Application No. 202010773228.X, entitled "method for preparing ammonium thiomolybdate-porous amorphous carbon composite superlubricity film" filed with the Chinese National Intellectual Property Administration on Aug. 4, 2020, which is incorporated herein by reference in its entirety.

TECHNICAL FIELD

The present disclosure relates to a composite superlubricity film, and particularly to a method for preparing an ammonium thiomolybdate-porous amorphous carbon composite superlubricity film, belonging to the technical fields of vacuum coating and tribology.

BACKGROUND

Friction and wear pose a common problem in mechanical systems. Friction consumes more than 30% of the disposable energy, and wear causes 60% of the failure of mechanical components. With the development of industrial upgrading, the energy saving, emission reduction, high reliability, and long life of automobiles, aircraft, equipment manufacturing, aerospace and other equipment are closely related to high-performance solid lubricating materials. Among them, there is a particularly urgent need for high-performance lubricating material technology in automobiles, heavy machinery, and aerospace. The lack of research on tribological mechanisms, materials and technologies of basic components such as engine piston ring, valve, tappet, camshaft, piston pin and other key components, fuel injection system plunger, needle valve and other components, aircraft hydraulic power steering system, turbo compression system, aerospace system bearing, flywheel, Torque gyrostat and other systems key components, severely limited the upgrading and performance improvement of high-end equipment.

Generally, lubricating oil has a friction coefficient of around 0.05, and "superlubricity" specifically refers to a state where the friction coefficient is on the order of 0.001 or lower. The practical application of superlubricity lubricating material(s) will greatly reduce frictional power consumption and wear, which not only improves energy efficiency, but also extends the service life of moving parts and improves reliability. CN201910688409.X provides a method for realizing superlubricity between an AFM probe with a tapered tip and a graphite surface, which realizes a superlubricity at micrometer-scale contacts with a friction coefficient as low as 0.001. CN201510582261.3 provides a method for preparing a silver-containing graphite-like carbon film with a super-low friction coefficient by a magnetron sputtering, but its actual friction coefficient is greater than 0.01, which does not achieve true superlubricity (with a super-low friction). CN201710403632.6 provides a method for realizing a macroscopic superlubricity by growing graphene on a frictional surface. The friction coefficient is constant at 0.003-0.008, but graphene can only grow on the surface of catalytic metals such as nickel-iron, which limits its engineering application. CN201110277261.4 provides a diamond-like composite molybdenum disulfide nano-multilayer film and a preparation method thereof; it asserts to achieve an super-low friction coefficient (0.02-0.03) in an atmospheric environment, but the friction coefficient has a difference of one order of magnitude from the friction coefficient range defined by superlubricity. Therefore, there is an urgent need for a solid lubricating film material with lower friction coefficient and lower energy consumption.

SUMMARY

An object of the present disclosure is to provide a method for preparing an ammonium thiomolybdate-porous amorphous carbon composite superlubricity film.

I. Preparation of an Ammonium Thiomolybdate-Porous Amorphous Carbon Composite Superlubricity Film In the present disclosure, the method for preparing an ammonium thiomolybdate-porous amorphous carbon composite superlubricity film comprises steps of (1) preparation of a transition layer with a high bonding force: cleaning a substrate under an ultrasonic, placing the cleaned substrate in a vacuum chamber, and vacuuming the vacuum chamber to $1 \times 10^{-3}$ Pa; performing a deposition for 20 minutes by a magnetron sputtering by utilizing $Ti_{0.7}Ni_{0.3}$ target under conditions of a magnetron sputtering current of 5 A, and an argon pressure of 1 Pa; then under the above conditions unchanged, introducing an argon mixture containing nitrogen, and performing another deposition for 40 minutes, to obtain a transition layer on the substrate, wherein the substrate is selected from the group consisting of stainless steel, gear steel, and bearing steel;

(2) preparation of a porous amorphous carbon film: preparing a porous amorphous carbon film by a reactive magnetron sputtering method by utilizing an aluminum-carbon composite target containing aluminum, under conditions of reaction gases being argon, carbon tetrafluoride, hydrogen and oxygen with a flow ratio of 2:1:1:0.2, a pressure of 1-3 Pa, a magnetron sputtering current of 4 A, and a deposition time of 40-60 minutes, to obtain a porous carbon film, which comprises a microporous with a diameter of 20-40 nm;

(3) preparation of an ammonium thiomolybdate solution: dissolving ammonium thiomolybdate solid powder in deionized water, and stirring the resulting mixture with a magnetic stirrer under an ultrasonic, to obtain an ammonium thiomolybdate solution with a concentration of 1 to 3 mass/volume, wherein the ultrasonic has a power of 500 W, and a frequency of 200 Hz, and the stirring is performed at a rotation speed of 10 revolutions per minute, and wherein the ammonium thiomolybdate is selected from the group consisting of ammonium trithiomolybdate, ammoniumtetrathiomolybdate, and ammonium pentathiomolybdate.

(4) preparation of the ammonium thiomolybdate-porous amorphous carbon composite superlubricity film: impregnating the porous amorphous carbon film in the ammonium thiomolybdate solution for 4 to 5 hours, and taking the impregnated porous amorphous carbon film out and air drying, to obtain the ammonium thiomolybdate-porous amorphous carbon composite superlubricity film, wherein in the ammonium thiomolybdate-porous amorphous carbon composite superlubricity film, the ammonium thiomolybdate is supported in the nano holes and on the surface of the film.

II. Friction Properties of the Ammonium Thiomolybdate-Porous Amorphous Carbon Composite Superlubricity Film The ammonium tetrathiomolybdate-porous amorphous carbon composite superlubricity film is taken for an example, and subjected to a friction test in reciprocating mode under conditions of a load of 5 N, a frequency of 5 Hz, a diameter of the counterpart balls of 6 mm, and a testing sustaining time of 30 min, and a reciprocating distance of 5 mm. The results are shown in FIG. 2. The average friction coefficient is 0.0057, indicating that super lubricity is completely realized.

Experiments show that the ammonium thiomolybdate-porous amorphous carbon composite superlubricity film obtained by replacing ammonium tetrathiomolybdate with ammonium thiomolybdate or ammonium pentathiomolybdate also enables super lubricity to be realized.

The principle of realizing superlubricity in the present disclosure is as follows: during the friction process, the composited porous amorphous carbon superlubricity film prepared in the present disclosure promotes the in-situ decomposition of ammonium thiomolybdate to generate molybdenum disulfide by utilizing the friction heat at the initial stage of running-in, and further to generate a graphene-like structure in the presence of a catalyst (as shown in FIG. 1), thus realizing a macroscopic super lubricity through a heterogeneous incommensurate contact between graphene and molybdenum disulfide. In addition, ammonium thiomolybdate is supported on the porous amorphous carbon film through a liquid-phase impregnation, and then air dried, to form a film with a good uniformity and a good bonding force. Therefore, the prepared composited porous amorphous carbon superlubricity film has a longer service life.

DETAILED DESCRIPTION OF THE EMBODIMENTS

The preparation and performance of the ammonium tetrathiomolybdate-porous amorphous carbon composite superlubricity film of the present disclosure will be further illustrated with reference to specific examples below.

Example 1

(1) Preparation of a porous amorphous carbon film: the porous amorphous carbon film was prepared on a substrate by an anode layer ion source assisted plasma chemical vapor deposition method and a reactive magnetron sputtering method. The specific procedures were as follows:

i. cleaning of the substrate: the stainless steel substrate was cleaned under an ultrasonic, and the cleaned stainless steel substrate was put into a vacuum chamber, and then the vacuum chamber was vacuumed to $1 \times 10^{-3}$ Pa to start a deposition;

ii. deposition of a transition layer: deposition was performed by a magnetron sputtering method by utilizing $Ti_{0.7}Ni_{0.3}$ target for 20 minutes, under conditions of a current of 5 A, a deposition bias voltage of 200 V, argon atmosphere, and a pressure of 1 Pa; under the above conditions unchanged, an argon mixture containing nitrogen was introduced, and another deposition was performed for 40 minutes;

iii. preparation of a porous carbon film: a magnetron sputtering was performed by utilizing aluminum-carbon composite target containing aluminum, under conditions of reaction gases being argon, carbon tetrafluoride, hydrogen and oxygen with a flow ratio of 2:1:1:0.2, a pressure of 1 Pa, a magnetron sputtering current of 4 A, and a time of 60 minutes, obtaining a porous carbon film, which comprises a microporous with a diameter of 20-40 nm.

(2) 0.1 g of ammonium tetrathiomolybdate solid powder was dissolved in 10 mL of deionized water, and they were stirred with a magnetic stirrer under an ultrasonic, obtaining an ammonium tetrathiomolybdate solution with a concentration of 1%, wherein the ultrasonic has a power of 500 W, and a frequency of 200 Hz, and the stirring was performed at a rotation speed of 10 revolutions per minute.

(3) The prepared porous amorphous carbon film was impregnated in the ammonium tetrathiomolybdate solution with a concentration of 1% for 5 hours, and the impregnated porous amorphous carbon film was air dried, obtaining an ammonium tetrathiomolybdate-porous amorphous carbon composite superlubricity film.

Figure 1A:
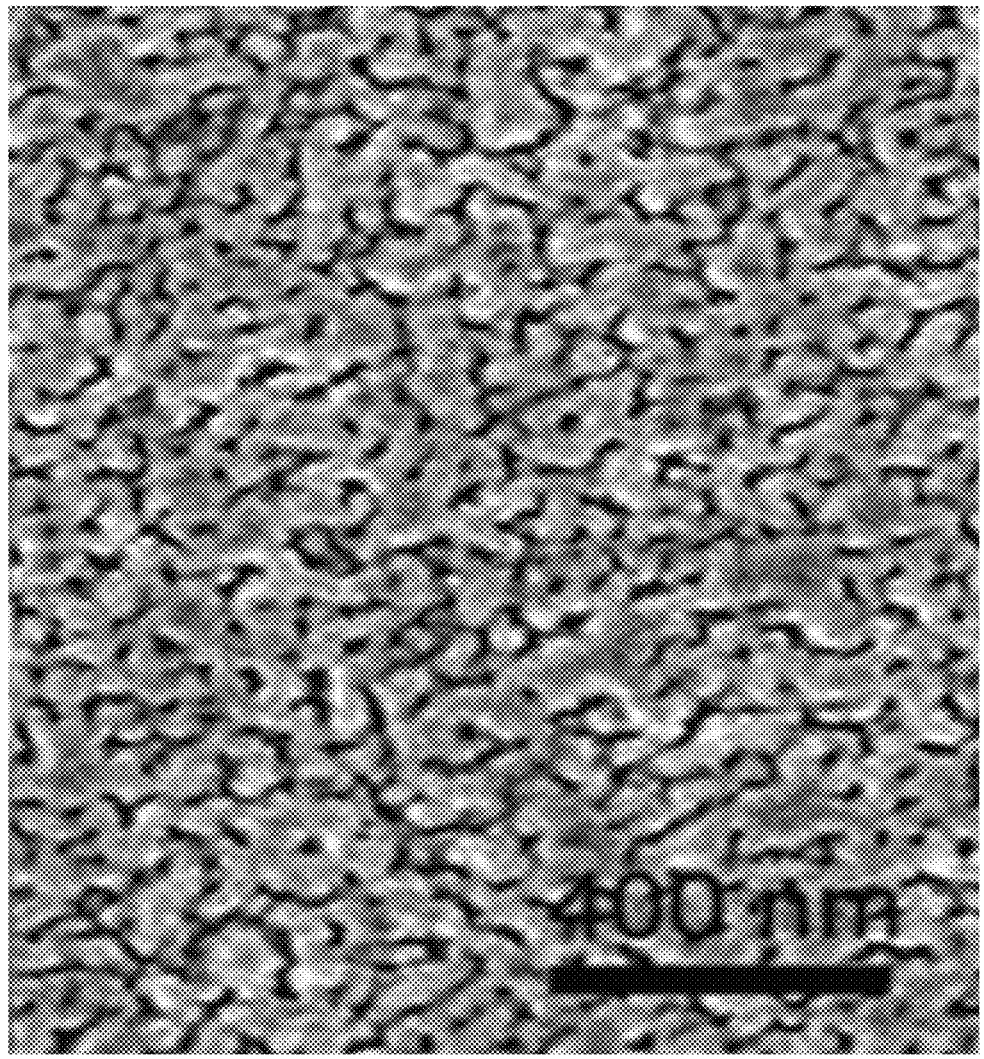
FIG. 1A shows a scanning electron microscope image illustrating the surface structure of the ammonium tetrathiomolybdate-porous amorphous carbon composite superlubricity film prepared in some embodiments of the present disclosure.
Figure 1B:
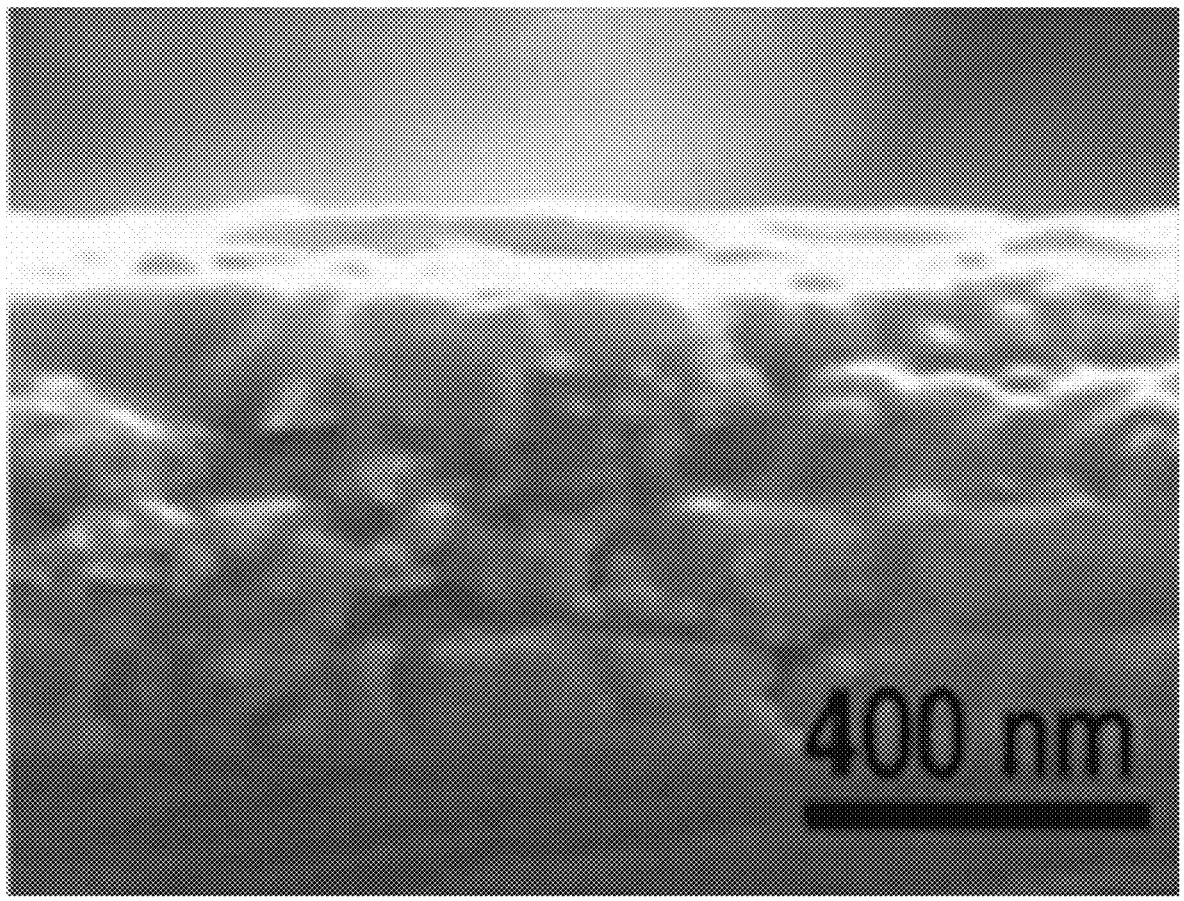
FIG. 1B shows a scanning electron microscope image illustrating a cross section view of the ammonium tetrathiomolybdate-porous amorphous carbon composite superlubricity film prepared in some embodiments of the present disclosure.
Figure 2:
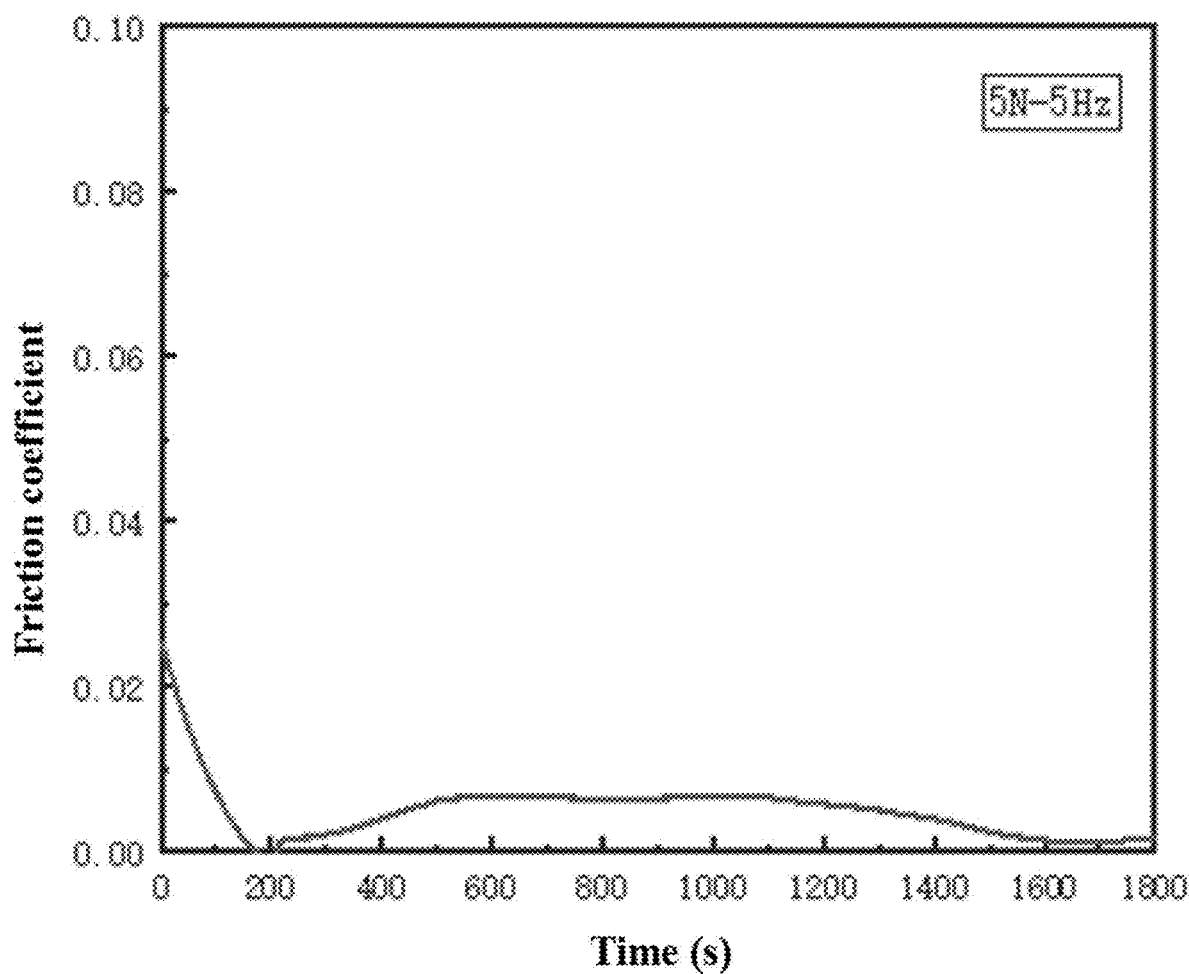
FIG. 2 shows a friction curve of the ammonium tetrathiomolybdate-porous amorphous carbon composite superlubricity film prepared in some embodiments of the present disclosure.

(4) The ammonium tetrathiomolybdate-porous amorphous carbon composite superlubricity film was subjected to a friction test under conditions of a load of 5 N, a frequency of 5 Hz, a diameter of counterpart balls of 6 mm, a testing sustaining time of 30 min, and a reciprocating distance of 5 mm, and the results showed that the average friction coefficient was 0.0057, as shown in FIG. 2.

Example 2

(1) Preparation of a porous amorphous carbon film: the porous amorphous carbon film was prepared on a substrate by an anode layer ion source assisted plasma chemical vapor deposition method and a reactive magnetron sputtering method. The specific procedures were as follows:

i. cleaning of the substrate: a gear steel substrate was cleaned under an ultrasonic, and the cleaned stainless steel substrate was put into a vacuum chamber, and then the vacuum chamber was vacuumed to $1 \times 10^{-3}$ Pa to start a deposition;

ii. deposition of a transition layer: deposition was performed by a magnetron sputtering method by utilizing $Ti_{0.7}Ni_{0.3}$ target for 20 minutes, under conditions of a current of 5 A, a deposition bias voltage of 200 V, argon atmosphere, and a pressure of 1 Pa; under the above conditions unchanged, an argon mixture containing nitrogen was introduced, and another deposition was performed for 40 minutes;

iii. preparation of a porous carbon film: a magnetron sputtering was performed by utilizing aluminum-carbon composite target containing aluminum, under conditions of reaction gases being argon, carbon tetrafluoride, hydrogen and oxygen with a flow ratio of 2:1:1:0.2, a pressure of 1 Pa, a magnetron sputtering current of 4 A, and a deposition time of 60 minutes, obtaining a porous carbon film, which comprises a microporous with a diameter of 20-40 nm.

(2) 0.2 g of ammonium tetrathiomolybdate solid powder was dissolved in 10 mL of deionized water, and they were stirred with a magnetic stirrer under an ultrasonic, obtaining an ammonium tetrathiomolybdate solution with a concentration of 1%, wherein the ultrasonic has a power of 500 W, and a frequency of 200 Hz, and the stirring was performed at a rotation speed of 10 revolutions per minute.

(3) The prepared porous amorphous carbon film was impregnated in the ammonium tetrathiomolybdate solution with a concentration of 1% for 5 hours, and the impregnated porous amorphous carbon film was air dried, obtaining an ammonium tetrathiomolybdate-porous amorphous carbon composite superlubricity film.

(4) The ammonium tetrathiomolybdate-porous amorphous carbon composite superlubricity film was subjected to a friction test under conditions of a load of 5 N, a frequency of 5 Hz, a diameter of counterpart balls of 6 mm, a testing sustaining time of 30 min, and a reciprocating distance of 5 mm, and the results showed that the average friction coefficient was 0.0053.

Example 3

(1) Preparation of a porous amorphous carbon film: the porous amorphous carbon film was prepared on a substrate by an anode layer ion source assisted plasma chemical vapor deposition method and a reactive magnetron sputtering method. The specific procedures were as follows:

i. cleaning of the substrate: a bearing steel substrate was cleaned under an ultrasonic, and the cleaned stainless steel substrate was put into a vacuum chamber, and then the vacuum chamber was vacuumed to $1\times10^{-3}$ Pa to start a deposition;

ii. deposition of a transition layer: deposition was performed by a magnetron sputtering by utilizing $Ti_{0.7}Ni_{0.3}$ target for 20 minutes, under conditions of a current of 5 A, a deposition bias voltage of 200 V, argon atmosphere, and a pressure of 1 Pa; under the above conditions unchanged, an argon mixture containing nitrogen was introduced, and another deposition was performed for 40 minutes;

iii. preparation of a porous carbon film: a magnetron sputtering was performed by utilizing aluminum-carbon composite target containing aluminum, under conditions of reaction gases being argon, carbon tetrafluoride, hydrogen and oxygen with a flow ratio of 2:1:1:0.2, a pressure of 1 Pa, a magnetron sputtering current of 4 A, and a deposition time of 60 minutes, obtaining a porous carbon film, which comprises a microporous with a diameter of 20-40 nm.

(2) 0.3 g of ammonium tetrathiomolybdate solid powder was dissolved in 10 mL of deionized water, and they were stirred with a magnetic stirrer under an ultrasonic, obtaining an ammonium tetrathiomolybdate solution with a concentration of 1%, wherein the ultrasonic has a power of 500 W, and a frequency of 200 Hz, and the stirring was performed at a rotation speed of 10 revolutions per minute.

(3) The prepared porous amorphous carbon film was impregnated in the ammonium tetrathiomolybdate solution with a concentration of 1% for 5 hours, and the impregnated porous amorphous carbon film was air dried, obtaining an ammonium tetrathiomolybdate-porous amorphous carbon composite superlubricity film.

(4) The ammonium tetrathiomolybdate-porous amorphous carbon composite superlubricity film was subjected to a friction test under conditions of a load of 5 N, a frequency of 5 Hz, counterpart balls having a diameter of 6 mm, a testing sustaining time of 30 min, and a reciprocating distance of 5 mm, and the results showed that the average friction coefficient was 0.0052.

What is claimed is:

1. A method for preparing an ammonium thiomolybdate-porous amorphous carbon composite superlubricity film, comprising:
   preparing a transition layer by:
      cleaning a substrate under ultrasound,
      placing the cleaned substrate in a vacuum chamber,
      vacuuming the vacuum chamber to $1\times10^{-3}$ Pa,
      performing a deposition for 20 minutes by magnetron sputtering utilizing a $Ti_{0.7}Ni_{0.3}$ target under conditions of a magnetron sputtering current of 5 A, and an argon pressure of 1 Pa,
   under the conditions, introducing an argon mixture containing nitrogen, and performing another deposition for 40 minutes, to obtain a transition layer on the substrate;
   preparing a porous amorphous carbon film by:
      performing reactive magnetron sputtering utilizing an aluminum-carbon composite target containing aluminum, under conditions of reaction gases being argon, carbon tetrafluoride, hydrogen and oxygen with a flow ratio of 2:1:1:0.2, a pressure of 1-3 Pa, a magnetron sputtering current of 4 A, and a deposition time of 40-60 minutes, to obtain a porous amorphous carbon film;
   preparing an ammonium thiomolybdate solution by:
      dissolving ammonium thiomolybdate solid powder in deionized water, and
      stirring the resulting mixture with a magnetic stirrer under ultrasound, to obtain an ammonium thiomolybdate solution with a concentration of 1 to 3% mass/volume;
   preparing the ammonium thiomolybdate-porous amorphous carbon composite superlubricity film by:
      impregnating the porous amorphous carbon film in the ammonium thiomolybdate solution for 4 to 5 hours, and
      taking the impregnated porous amorphous carbon film out and air drying, to obtain the ammonium thiomolybdate-porous amorphous carbon composite superlubricity film.

2. The method for preparing the ammonium thiomolybdate-porous amorphous carbon composite superlubricity film as claimed in claim 1, wherein, in the step of preparation of a transition layer, the substrate is selected from the group consisting of: stainless steel, gear steel, bearing steel, and combinations thereof.

3. The method for preparing the ammonium thiomolybdate-porous amorphous carbon composite superlubricity film as claimed in claim 1, wherein, in the step of preparation of an ammonium thiomolybdate solution, the ammonium thiomolybdate is selected from the group consisting of: ammonium trithiomolybdate, ammonium tetrathiomolybdate, ammonium pentathiomolybdate, and combinations thereof.

4. The method for preparing the ammonium thiomolybdate-porous amorphous carbon composite superlubricity film as claimed in claim 1, wherein, in the step of preparation of an ammonium thiomolybdate solution, the ultrasound has a power of 500 W, and a frequency of 200 Hz, and the stirring is performed at a rotation speed of 10 revolutions per minute.

* * * * *